(12) United States Patent
Jang et al.

(10) Patent No.: US 6,888,733 B2
(45) Date of Patent: May 3, 2005

(54) MULTIPLE CHIP SYSTEM INCLUDING A PLURALITY OF NON-VOLATILE SEMICONDUCTOR MEMORY DEVICES

(75) Inventors: Cheol-Ung Jang, Kyunggi-do (KR); Young-Joon Choi, Kyunggi-do (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 13 days.

(21) Appl. No.: 10/618,206

(22) Filed: Jul. 9, 2003

(65) Prior Publication Data

US 2004/0057297 A1 Mar. 25, 2004

(30) Foreign Application Priority Data

Jul. 9, 2002  (KR) .................................. 10-2002-0039632

(51) Int. Cl.$^7$ ................................................ G11C 5/02
(52) U.S. Cl. ............................. 365/51; 365/52; 365/191
(58) Field of Search .............................. 365/51, 52, 63, 365/189.01, 189.09, 185.33, 190, 191

(56) References Cited

U.S. PATENT DOCUMENTS

| | | | | |
|---|---|---|---|---|
| 5,812,814 A | * | 9/1998 | Sukegawa | .................... 711/103 |
| 5,822,251 A | * | 10/1998 | Bruce et al. | ........... 365/185.33 |
| 6,438,045 B1 | * | 8/2002 | King et al. | .................. 365/200 |
| 6,680,858 B2 | * | 1/2004 | Nakamura et al. | ............ 365/63 |

\* cited by examiner

*Primary Examiner*—Gene N. Auduong
(74) *Attorney, Agent, or Firm*—Marger Johnson & McCollom, P.C.

(57) ABSTRACT

A multiple chip memory system capable of providing state information relating to each chip embedded therein. The multiple chip memory system includes a first chip enabled by a first chip selection signal, and informing of a self state by a first ready/busy signal; and a second chip enabled by a second chip selection signal, and informing of a self state by a second ready/busy signal.

10 Claims, 5 Drawing Sheets

US 6,888,733 B2

MULTIPLE CHIP SYSTEM INCLUDING A PLURALITY OF NON-VOLATILE SEMICONDUCTOR MEMORY DEVICES

FIELD OF THE INVENTION

The present invention generally relates to a semiconductor memory device and, more specifically, to a multiple chip system embedding a plurality of non-volatile memory devices therein.

BACKGROUND OF THE INVENTION

The demand for electrically erasable and programmable non-volatile memory devices continues to increase in their applications. High capacity non-volatile memory devices are particularly advantageous because of successive developments with Riger frequencies and improved integration density.

Several technologies exist to embed a plurality of non-volatile memory devices on one chip. Doping so enhances data storage capacity for digital multimedia such as an SSD (Solid State Disk) and expansion memory cards.

FIG. 1 illustrates a conventional multiple chip memory system including a conventional multiple chip. Referring to FIG. 1, a first chip 102 and a second chip 104 are included in a multiple chip 100. A host 110 and the multi-chip 100 are connected through control signals CNT, ready/busy signals R/B1 and R/B2, an input/output bus I/O BUS, and chip enable signals CE1 and CE2. The first chip enable signal CE1 selects the first chip 102 and the second chip enable signal CE2 selects the second chip 104. The ready/busy signals R/B1 and R/B2 arise respectively from the first chip 102 and the second chip 104. The R/B1 signal indicates a ready or busy state of the first chip 102. The R/B2 signal indicates a ready or busy state of the second chip 104. The r/B1 and R/B2 signals merge into a single ready/busy signal R/B provided to the host 110. FIG. 2 is a timing diagram of the system 100 shown in FIG. 1.

Referring to FIG. 2, a setup command of a memory system and address corresponding to the first and second chips are introduced into the memory system before data is loaded on the input/output bus I/O BUS. Data assigned to the first and second chips are inputted: data such as DATA10, DATA11 and DATA12 correspond to the first chip; and data such as DATA20, DATA21 and DATA22 correspond to the second chip. For example, it is assumed that the data from DATA 10 through DATA22, which are loaded into the input/output bus I/O BUS, are programmed in the first and second chips 102 and 104 of FIG. 1, respectively. In this case, the R/B1 signal has periods BUSY_, BUSY_11 and BUSY_12, which are activated to a low level until the data DATA10, DATA11 and DATA12, respectively are fully programmed in the first chip 102. Accordingly, if each of the R/B1 signal and R/B2 signals is low, the R/B signal is also low. A low level R/B signal indicates to the host 110 that the chip 110 cannot perform other commands because it is busy.

Even though the first chip 102 is ready to receive other commands after completing a cycle, it does not because the R/B signal indicates it is busy. A solution would be to hold the chip 102 on a standby state during a tloss time until R/B2 is high. The tloss period deteriorates system performance.

Accordingly, a need remains for a multiple chip system capable of improved performance.

SUMMARY OF THE INVENTION

The present invention addresses disadvantages associated with prior art devices.

The semiconductor memory device of the present invention includes a first chip adapted to generate a first ready/busy signal, the first ready/busy signal indicating the first chip is busy. A second chip is adapted to generate a second ready/busy signal, the second ready/busy signal indicating the second chip is busy. The first ready/busy signal is distinct from the second ready/busy signal.

The first chip is adapted to operate responsive to a first chip enable signal and the second chip is adapted to operate responsive to a second chip enable signal.

The first and second chips are adapted to operate responsive to control signals from a host.

The memory device further includes a third chip connected in parallel with the first chip and a fourth chip is connected in parallel with the second chip. The first ready/busy signal indicates the third chip is busy and the second ready/busy signal indicates the fourth chip is busy. The third chip is adapted to operate responsive to a first chip enable signal and the fourth chip is adapted to operate responsive to a second chip enable signal.

DESCRIPTION OF THE EXEMPLARY EMBODIMENT

The present invention will now be described more fully hereinafter with reference to the accompanying drawings, in which exemplary embodiments of the invention are shown. This invention may, however, be embodied in different forms and should not be constructed as limited to the embodiments set forth herein. Rather, these embodiments are provided so that this disclosure will be thorough and complete, and will fully convey the scope of the invention to those skilled in the art.

Figure 1:
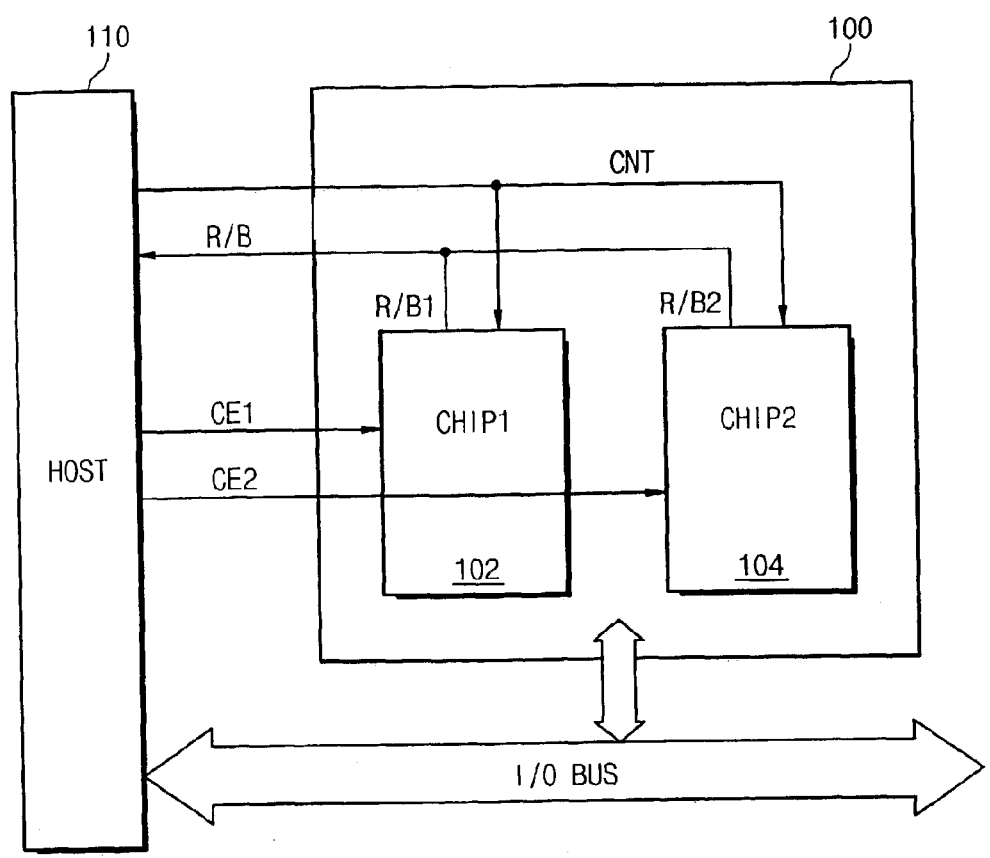
FIG. 1 is a block diagram of a conventional multiple chip memory system.
Figure 2:
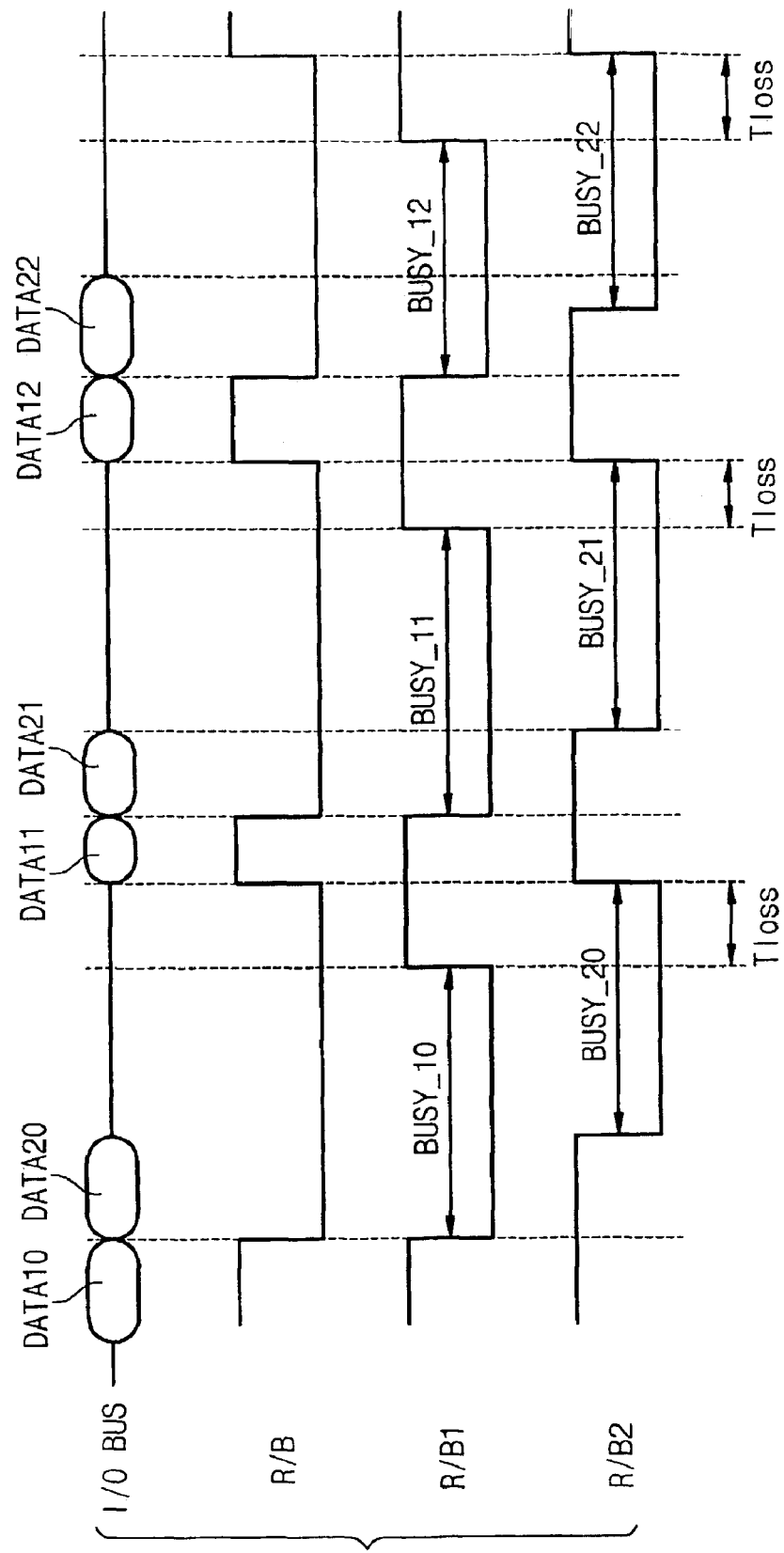
FIG. 2 is a timing diagram associated with the multiple chip memory system of FIG. 1.
Figure 3:
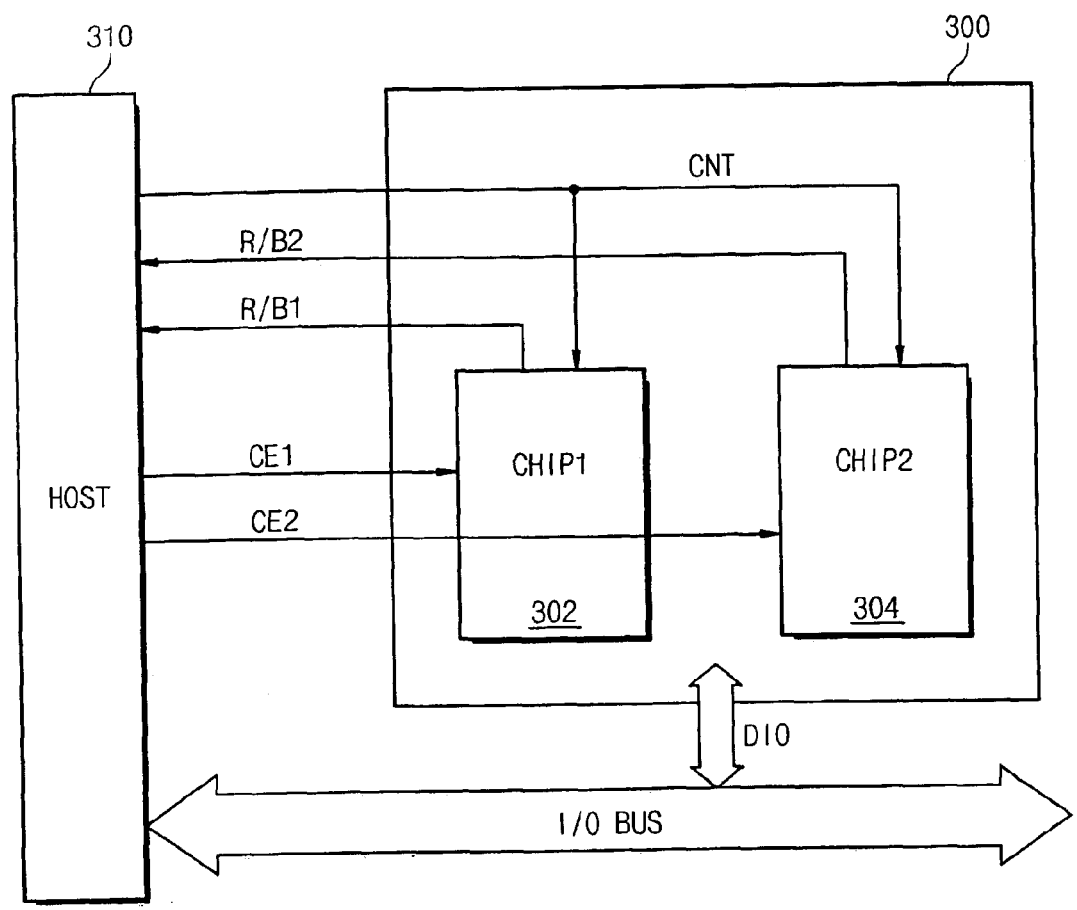
FIG. 3 is a block of an embodiment of a multiple chip system of the present invention.

FIG. 3 is a block diagram of embodiment of a multiple chip memory system of the present invention. The multiple chip 300 includes first and second chips 302 and 304, respectively. The chip 30 interfaces to a host 310 by control signals CNT, a first chip selection signal CE1, a second chip selection signal CE2, a R/B 1 signal, and a R/B 2 signal. Input/output data DIO is interchanged between an input/output bus I/O BUS and the multiple chip 310. The host 310 includes a microprocessor (not shown) to control the memory system. The first chip 302 is assigned to the first chip selection signal CE1 and the R/B1 signal, while the second chip 304 to the second chip selection signal CE2 and the R/B2 signal. The first and second chips 302 and 304, respectively, share the input/output data DIO by the control signals INT. The timing of the memory system 300 is shown in FIG. 4.

Figure 4:
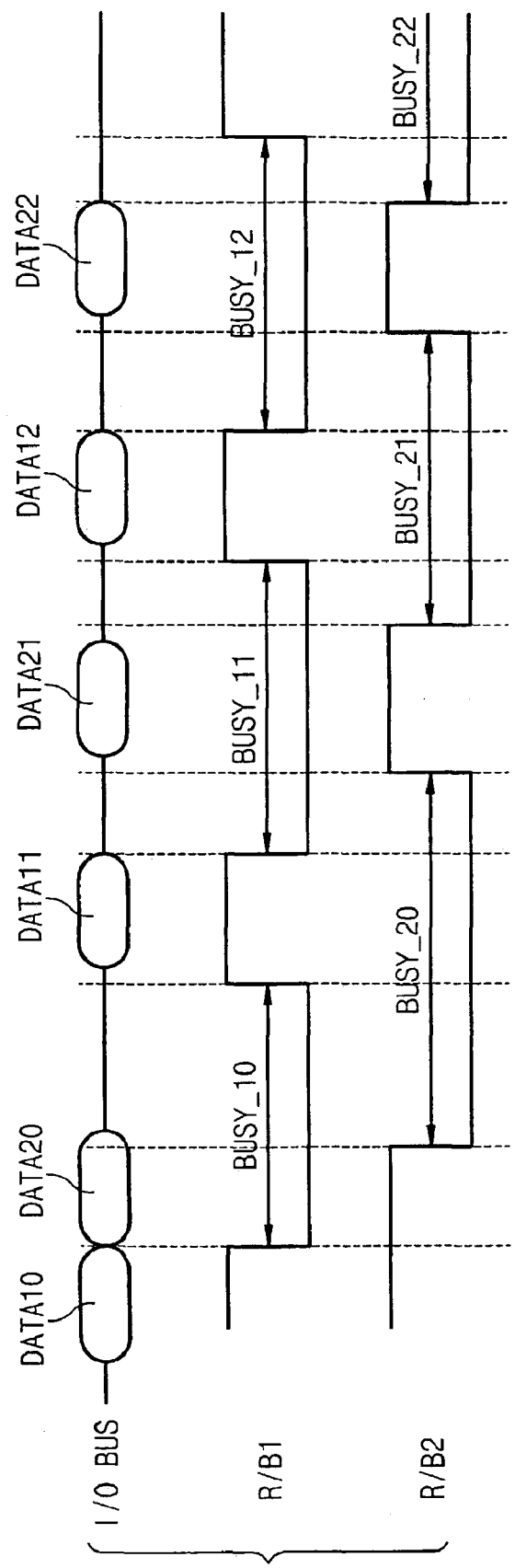
FIG. 4 is a timing diagram associated with the multiple chip memory system of FIG. 3.

Referring to FIG. 4, first data DATA10-DATA12 and second data DATA20-DATA22 are loaded on the input/ output bus (I/O BUS) for programming the first and second chips 302 and 304, respectively. While the first data DATA10-DATA12 are being programmed in the first chip 302, the R/B1 signal is active with a low level (BUSY_10, BUSY_11 and BUSY_12) to inform the host 310 that the first chip 302 is busy. While the second data DATA20-DATA22 is programmed in the second chip 304, the R/B2 signal is active with low level (BUSY_20, BUSY_21 and BUSY_22) to inform the host 310 that the second chip 304 is busy.

In the memory system of the present embodiment, the R/B1 signal and R/B2 signal independently inform the host 310 of states of the first and second chips 302 and 304, respectively. By doing so, the host 310 can transmit commands to the chip 302, for example while the second chip 304 is busy.

The first chip 302 can, therefore perform, host 310's command without waiting for the second chip 304 to be ready.

Figure 5:
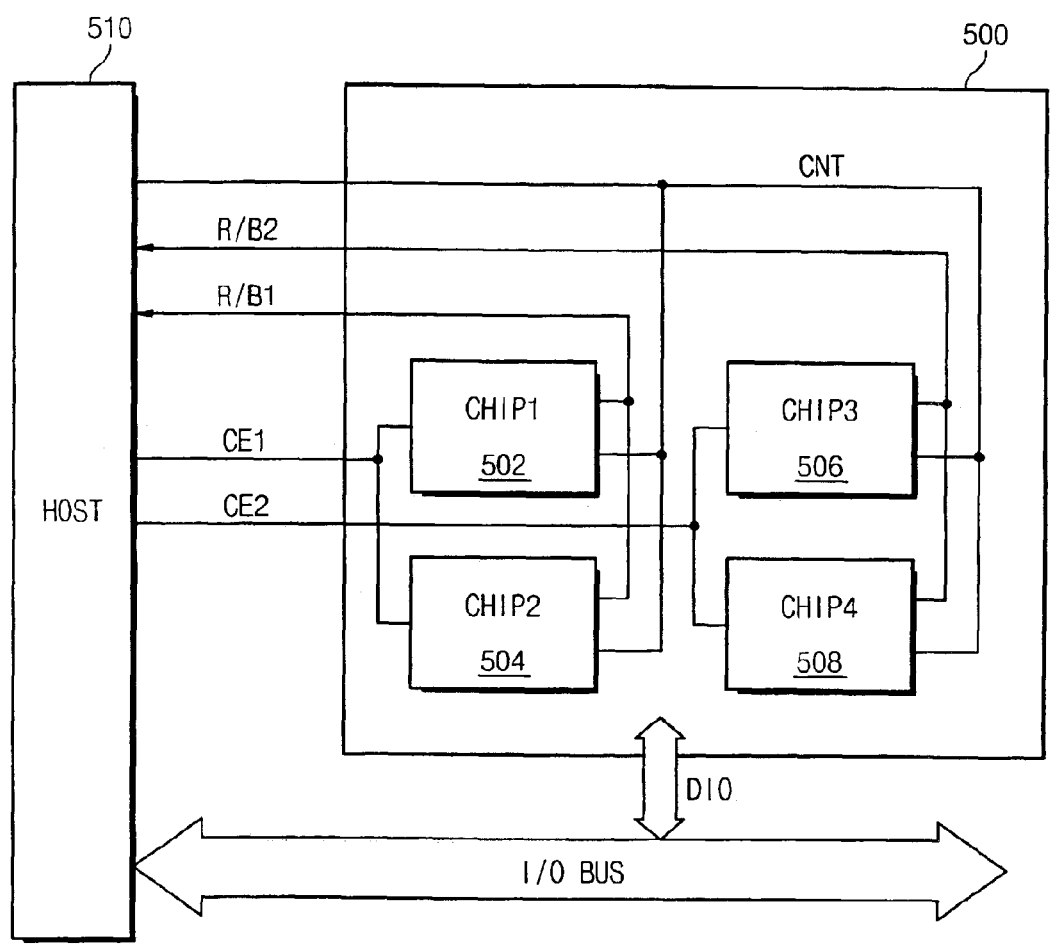
FIG. 5 is a block diagram of another embodiment of a multiple chip system of the present invention.

FIG. 5 is a block diagram of another embodiment of the present invention. Referring to FIG. 5, the multiple chip 500 includes first to fourth chips 502, 504, 506 and 508, respectively. The multiple chip 500 interfaces with a host 510 by control signals CNT, a first chip selection signal CE1, a second chip selection signal CE2, a R/B1 signal, and a R/B2 signal. Input/output data DIO is interchanged between an input/output bus I/O BUS. The first and second chips 502 and 504, respectively, are assigned to the first chip selection signal CE1 and the first R/B1 signal. The third and fourth chips 506 and 508, respectively, are assigned the second chip selection signal CE2 and the second R/B2 signals. The control signals and the input/output data DIO are commonly shared by the first through fourth chips 502, 504, 506 and 508, respectively.

Comparing the chip 500 with the chip 300, the first chip 302 corresponds to the first and second chips 502 and 504, respectively, and the second chip 304 to the third and fourth chips 506 and 508, respectively considering in view of signal assignment pattern with the chip selection signals and the ready/busy signals. The multiple chip 500, therefore has double the capacity of the chip 300. The R/B1 and the R/B2 signals independently inform the host 310 of states of the first and second chips 302 and 304, respectively, and the states of the third and fourth chips 306 and 308, respectively. If the first and second chips 502 and 504 are in ready states, the host 510 can send a command to regardless of the busy states of the chips 506 and 508. The first and second chips 502 and 504, therefore are, can respond to an instruction from the host 510 without waiting for a termination of the busy states in the third and fourth chips 506 and 508, respectively.

According to the multiple chip memory system of the present invention described above, ready chips can carry out an operation by an external host without waiting for other chips. The memory system of the present invention is not subject to a conventional time loss (Tloss), and therefore, its performance is improved.

This invention may, however, be embodied in different forms and should not be constructed as limited to the embodiments set fourth herein. Therefore, it is possible to recognize and control a state of each chip in an external host by R/B signals corresponding to the embedded chips of a multiple chip system.

We claim:

1. A semiconductor memory device, comprising:
   a first device to generate a first ready/busy signal, the first ready/busy signal indicating the first chip is busy; and
   a second device to generate a second ready/busy signal, the second ready/busy signal indicating the second chip is busy;
   where the first and second devices are in a single integrated circuit;
   where the first ready/busy signal is distinct from the second ready/busy signal; and
   where the first and second ready/busy signals are provided directly to a host from the semiconductor memory device.

2. The semiconductor memory device of claim 1
   where the first chip is adapted to operate responsive to a first chip enable signal; and
   where the second chip is adapted to operate responsive to a second chip enable signal.

3. The semiconductor memory device of claim 1
   where the first and second chips are adapted to operate responsive to control signals from a host.

4. The semiconductor memory device of claim 1 comprising:
   a third chip connected in parallel with the first chip; and
   a fourth chip connected in parallel with the second chip;
   where the first ready/busy signal indicates the third chip is busy; and
   where the second ready/busy signal indicates the fourth chip is busy.

5. The semiconductor memory device of claim 4
   where the third chip is adapted to operate responsive to a first chip enable signal; and
   where the fourth chip is adapted to operate responsive to a second chip enable signal.

6. A device, comprising:
   first chip means for generating a first status signal; and
   second chip means for generating a second status signal, the second status signal being distinct from the first status signals;
   where the first and second chip means are in a single integrated circuit; and
   where the first and second status signals are provided directly to a host from the semiconductor memory device.

7. The device of claim 6
   where the first chip means operates responsive to a first enable signal; and
   where the second chip means operates responsive to a second enable signal.

8. The device of claim 7
   where the first and second chip means operate responsive to control signals.

9. The device of claim 8 comprising:
   third chip means for generating the first status signal; and
   fourth chip means for generating the second status signal;
   where the first status signal indicates the first or third chip means are busy; and where the second status signal indicates the second or fourth chip means are busy.

10. The device of claim 9
    where the third chip means is adapted to operate responsive to the first chip enable signal; and
    where the fourth chip means is adapted to operate responsive to the second chip enable signal.

* * * * *

UNITED STATES PATENT AND TRADEMARK OFFICE
CERTIFICATE OF CORRECTION

PATENT NO. : 6,888,733 B2
APPLICATION NO. : 10/618206
DATED : July 9, 2003
INVENTOR(S) : Jang et al.

It is certified that error appears in the above-identified patent and that said Letters Patent is hereby corrected as shown below:

At column 1, line 53, please replace "BUSY_, BUSY" with --BUSY_10, BUSY--

At column 4, line 40, please replace "status signals" with --status signal--

Signed and Sealed this

Nineteenth Day of September, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,888,733 B2 | Page 1 of 1 |
| APPLICATION NO. | : 10/618206 | |
| DATED | : May 3, 2005 | |
| INVENTOR(S) | : Jang et al. | |

It is certified that error appears in the above-identified patent and that said Letters Patent is hereby corrected as shown below:

At column 1, line53, please replace "BUSY_, BUSY" with --BUSY_10, BUSY--

At column 4, line 40, please replace "status signals" with --status signal--

This certificate supersedes Certificate of Correction issued September 19, 2006.

Signed and Sealed this

Seventh Day of November, 2006

JON W. DUDAS
*Director of the United States Patent and Trademark Office*